United States Patent
Lim

(10) Patent No.: US 11,676,982 B2
(45) Date of Patent: Jun. 13, 2023

(54) IMAGE SENSING DEVICE

(71) Applicant: SK hynix Inc., Icheon-si (KR)

(72) Inventor: Sung Woo Lim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 197 days.

(21) Appl. No.: 17/015,380

(22) Filed: Sep. 9, 2020

(65) Prior Publication Data

US 2021/0320138 A1 Oct. 14, 2021

(30) Foreign Application Priority Data

Apr. 13, 2020 (KR) .................. 10-2020-0044646

(51) Int. Cl.
  *H01L 27/146* (2006.01)

(52) U.S. Cl.
  CPC .... *H01L 27/14629* (2013.01); *H01L 27/1463* (2013.01); *H01L 27/14627* (2013.01)

(58) Field of Classification Search
  None
  See application file for complete search history.

(56) References Cited

U.S. PATENT DOCUMENTS

| | | | |
|---|---|---|---|
| 11,476,285 B2* | 10/2022 | Manda | H01L 27/14694 |
| 2018/0182806 A1* | 6/2018 | Jin | H01L 27/14627 |
| 2019/0074318 A1* | 3/2019 | Watanabe | H01L 27/1463 |
| 2021/0134874 A1* | 5/2021 | Park | H01L 27/14609 |

FOREIGN PATENT DOCUMENTS

| | | | |
|---|---|---|---|
| JP | 2004-193284 A | | 7/2004 |
| JP | 2004193284 A | * | 7/2004 |
| KR | 10-2011-0091375 A | | 8/2011 |
| KR | 10-2019-0024645 A | | 3/2019 |

* cited by examiner

*Primary Examiner* — Ali Naraghi
(74) *Attorney, Agent, or Firm* — Perkins Coie LLP

(57) ABSTRACT

An image sensing device includes a substrate, a first reflector, and at least one second reflector. The substrate includes a photoelectric conversion element corresponding to each unit pixel. The first reflector is disposed in a manner that at least some parts of the first reflector overlap with the photoelectric conversion element, and is configured to reflect incident light directed to the photoelectric conversion element in a direction away from the photoelectric conversion element. The second reflect disposed over the substrate is configured to reflect the incident light reflected by the first reflector in a direction along which the incident light moves again closer to the photoelectric conversion element.

19 Claims, 7 Drawing Sheets

IMAGE SENSING DEVICE

CROSS-REFERENCE TO RELATED APPLICATION

This patent document claims priority based upon Korean patent application No. 10-2020-0044646, filed on Apr. 13, 2020, the disclosure of which is incorporated by reference in its entirety as part of the disclosure of this patent document.

TECHNICAL FIELD

The technology and implementations disclosed in this patent document generally relate to an image sensing device including one or more reflector structures.

BACKGROUND

An image sensing device is a device for converting an optical image into electrical signals. With the recent development of automotive, medical, computer and communication industries, the demand for image sensing devices is increasing in various devices, for example, digital cameras, camcorders, personal communication systems (PCSs), game consoles, surveillance cameras, medical micro-cameras, robots, infrared (IR) sensing devices, etc.

Image sensing devices may be broadly classified into CCD (Charge Coupled Device) image sensing devices and CMOS (Complementary Metal Oxide Semiconductor) image sensing devices. CCD image sensing devices may have less noise and better image quality than CMOS image sensing devices. However, CMOS image sensing devices have a simpler and more convenient driving scheme, and thus may be preferred in some applications.

In addition, CMOS image sensing devices may allow conventional circuits to be integrated into a single chip, which makes it easy to miniaturize CMOS image sensing devices for implementation in a product, with the added benefit of consuming very low power. CMOS image sensing devices can be fabricated using a CMOS fabrication technology, which results in low manufacturing costs. CMOS image sensing devices have been widely used due to their suitability for implementation in a mobile device.

SUMMARY

Various embodiments of the disclosed technology relate to an image sensing device for effectively sensing light having an infrared wavelength band.

The embodiments of the disclosed technology relates to an image sensor configured to include a first reflector and a second reflector such that the optical path of incident light can increase in length and photoelectric conversion efficiency can be improved.

In accordance with an embodiment of the disclosed technology, an image sensing device may include a substrate structured to support a photoelectric conversion element which generates photocharges in response to light incident to the photoelectric conversion element, a first reflector located to spatially overlap with a portion of the photoelectric conversion element to receive light and configured to reflect the light incident to the photoelectric conversion element in a direction away from the photoelectric conversion element, and a second reflector disposed to be spaced from the first reflector and configured to reflect the light reflected by the first reflector back towards the photoelectric conversion element.

In some implementations, the image sensing device may further include a microlens configured to converge the light upon the photoelectric conversion element. The first reflector includes a first reflective surface that forms a first angle with respect to a top surface of the substrate. The second reflector includes a second reflective surface that forms a second angle with respect to a bottom surface of the microlens.

In some implementations, the first angle may be set to any one of 25°~35°.

In some implementations, the second angle may be set to any one of 42°~62°.

In some implementations, the second reflector may further include a vertical reflective surface formed to extend to the substrate while simultaneously having a predetermined angle with respect to the second reflective surface.

In some implementations, the first reflector may include at least one of a metal layer and a low refractive index layer.

In some implementations, the second reflector may include at least one of a metal layer and a low refractive index layer.

In some implementations, the second reflector is disposed at a boundary of a unit pixel including the photoelectric conversion element.

In some implementations, the image sensing device may further comprising an additional second reflector disposed on an opposite side of the second reflector such that the first reflector is disposed between the second reflector and the additional second reflector.

In some implementations, at least one of the first reflector and the second reflector includes at least one of aluminum (Al), silver (Ag), silicon oxide, copper (Cu), or tin (Sn).

In some implementations, the image sensing device may further include an isolation region configured to physically isolate the photoelectric conversion element from another photoelectric conversion element located adjacent to the photoelectric conversion element.

In some implementations, the second reflector may be configured to reflect the light reflected by the first reflector toward the isolation region.

In some implementations, the isolation region may include an inner layer and an outer layer surrounding the inner layer. The inner layer may include at least one of a metal layer or an air layer, and the outer layer may include an insulation layer.

In some implementations, the first reflector may further include a third reflective surface extending to the photoelectric conversion element. The third reflective surface may be configured to reflect the light reflected by the second reflective surface toward the isolation region.

In some implementations, the image sensing device may further include a line region disposed below the substrate. The line region may include a lower reflective layer that operates to reflect the light penetrated the substrate back toward the photoelectric conversion element.

In some implementations, the lower reflective layer may include at least one of silver (Ag), copper (Cu), and aluminum (Al).

In another aspect, an image sensing device is provided to include a substrate, an image sensing pixel supported by the substrate and including a photoelectric conversion element that generates photocharges in response to light incident to the photoelectric conversion element, a microlenses disposed over the image sensing pixel and configured to allow the light to converge upon the photoelectric conversion element and a reflecting structure disposed between the photoelectric conversion elements and the microlenses and configured to increase an optical path length of the light to reach the photoelectric conversion element.

In some other implementations, the reflecting structure includes a first reflector disposed over the photoelectric conversion element such that the first reflector has a portion overlapping with the photoelectric conversion element, the first reflector configured to reflect the light to be away from the photoelectric conversion element.

In some other implementations, the reflecting structure includes a second reflector disposed at a boundary of the image sensing pixel and configured to redirect the light reflected by the first reflector toward back to the photoelectric conversion element.

In some other implementations, the reflecting structure includes at least one of aluminum (Al), silver (Ag), silicon oxide, copper (Cu), or tin (Sn).

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
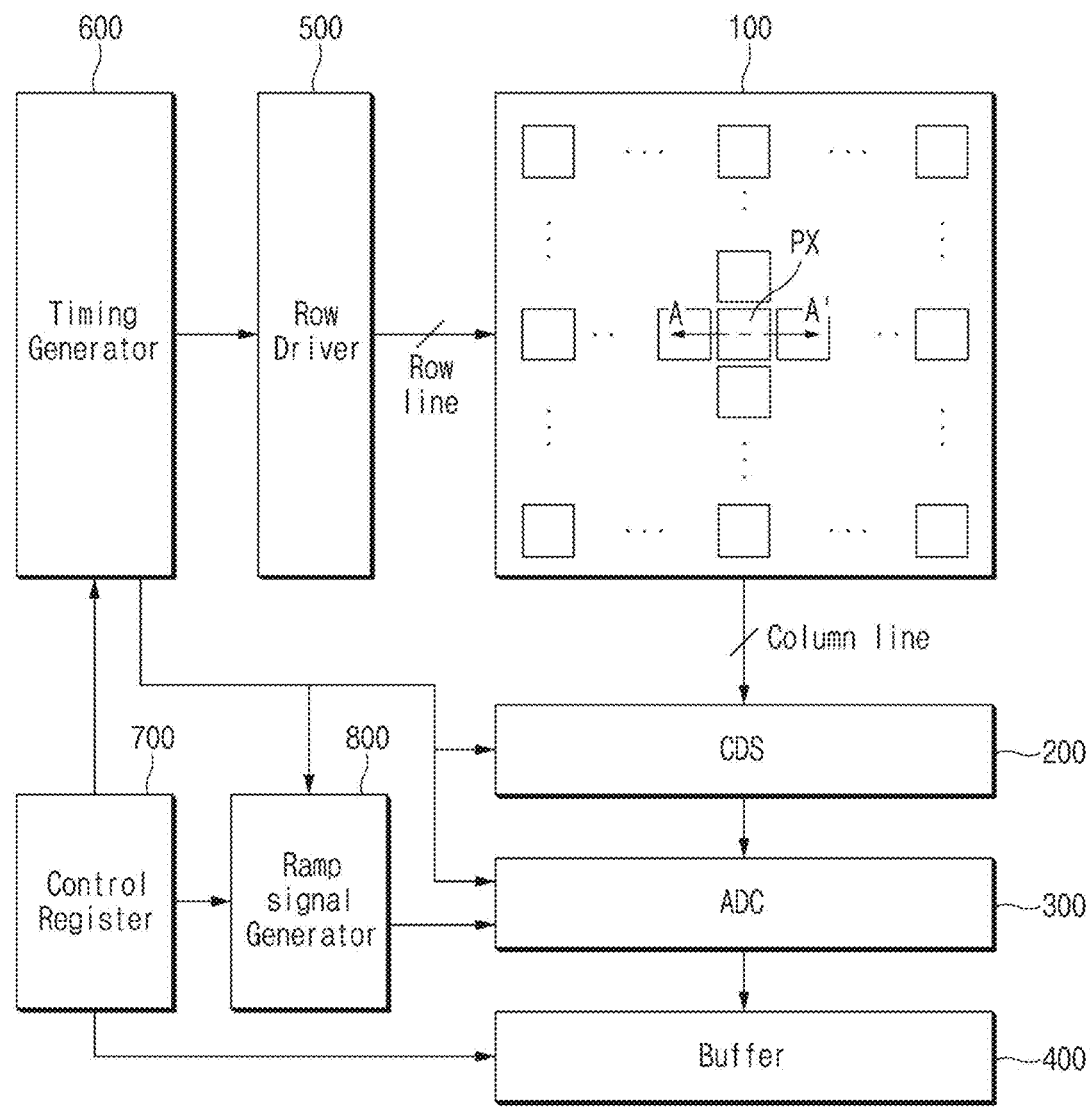
FIG. 1 is a block diagram illustrating an example of an image sensing device based on some implementations of the disclosed technology.

Some implementations of the disclosed technology relate to the image sensing device for effectively sensing light having an infrared wavelength band. Some implementations of the disclosed technology relate to an image sensor configured to include a first reflector and a second reflector such that the optical path of incident light can increase in length and photoelectric conversion efficiency can be improved. The disclosed technology provides various implementations of an image sensing device which can sense infrared (IR) light, and can increase sensitivity to the infrared (IR) light and photoelectric conversion efficiency.

Reference will now be made in detail to the embodiments of the disclosed technology, examples of which are illustrated in the accompanying drawings. While the disclosure is susceptible to various modifications and alternative forms, specific embodiments thereof are shown by way of example in the drawings. Thus, the disclosure should not be construed as being limited to the embodiments set forth herein.

Wherever possible, the same reference numbers will be used throughout the drawings to refer to the same or similar parts. In the following description, a detailed description of related known configurations or functions incorporated herein will be omitted to avoid obscuring the subject matter.

FIG. 1 is a block diagram illustrating an example of an image sensing device 10 based on some implementations of the disclosed technology.

Referring to FIG. 1, the image sensor 100 may include a pixel array 100, a correlated double sampler (CDS) 200, an analog-to-digital converter (ADC) 300, a buffer 400, a row driver 500, a timing generator 600, a control register 700, and a ramp signal generator 800. The above-mentioned components of the image sensing device 10 are merely examples. Some of the components can be omitted or additional components can be added based on additional demands The pixel array 100 may include a plurality of unit pixels (PXs) consecutively arranged in a two-dimensional (2D) shape including rows and columns. Each of the unit pixels (PXs) may convert incident light into an electrical signal to generate a pixel signal, and may output the pixel signal to the correlated double sampler (CDS) 200 through column lines.

Each unit pixel (PX) may include a photoelectric conversion element 140 to produce photocharges in response to incident light. The photoelectric conversion element 140 is supported by a substrate and, for example, may be formed in a substrate in some implementations. In some implementations, each photoelectric conversion element 140 may include a plurality of sub photoelectric conversion elements consecutively coupled to each other, such that each photoelectric conversion element 140 may be formed in a stacked structure of the sub photoelectric conversion elements. Each of the unit pixels (PXs) may be coupled to one of row lines and one of column lines.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample electrical image signals received from the pixels (PX) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive the pixel array 100 in units of a row line in response to an output signal of the timing generator 600. For example, the row driver 500 may generate a selection signal capable of selecting any one of the plurality of row lines. The selection signal may include a control signal needed to control on/off operations of a switching junction to be described later.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal output from the buffer 400 in response to a control signal received from the control register 700 and a timing signal received from the timing generator 600.

In the following description, although only some parts of the entire pixel array will hereinafter be described with reference to the attached drawings for convenience of description, the scope or spirit of the disclosed technology is not limited thereto, and it should be noted that the same concept can also be applied to the remaining parts other than the some parts of the pixel array as necessary.

Figure 2:
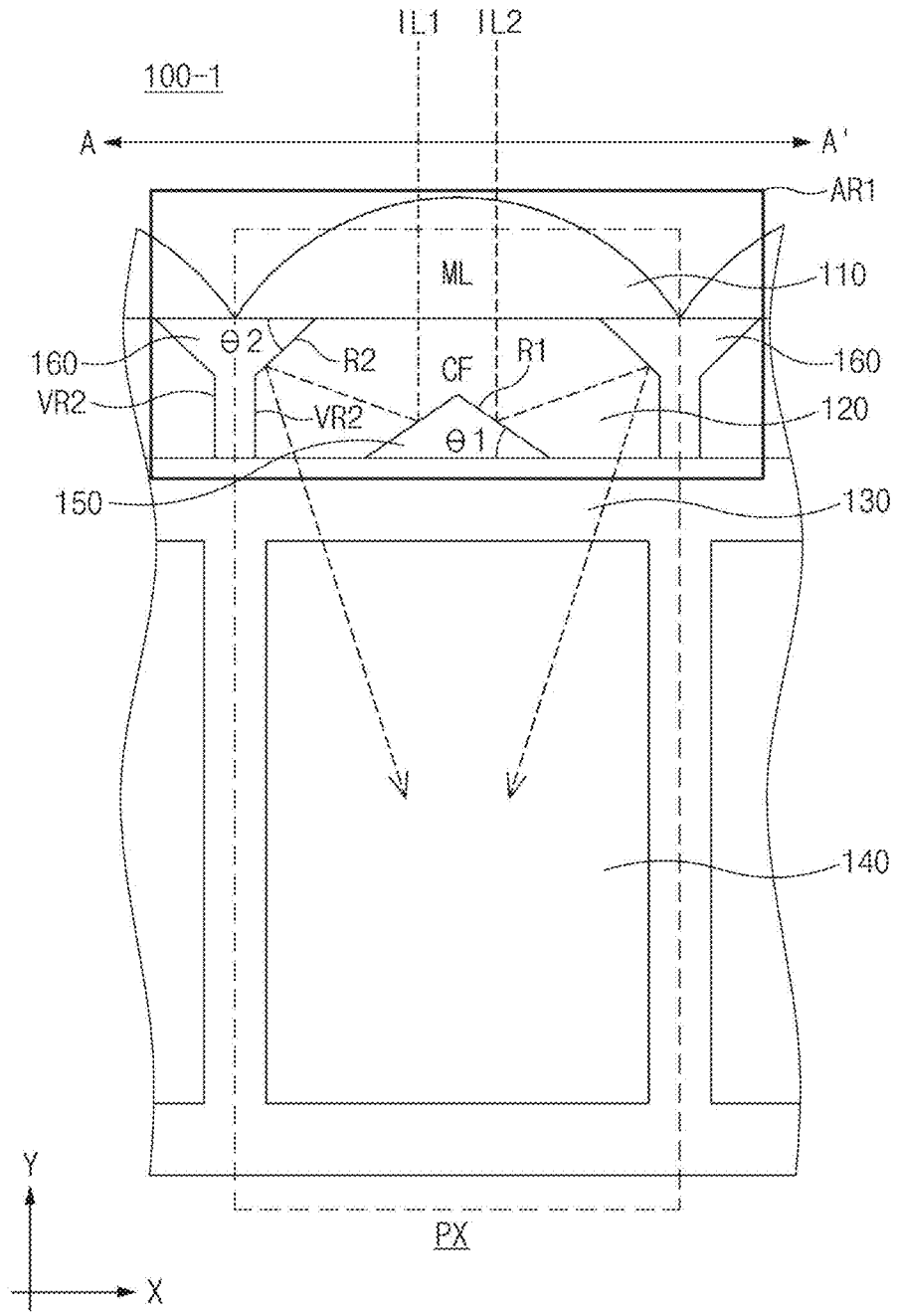
FIG. 2 is a cross-sectional view illustrating an example of a unit pixel taken along the line A-A' in a pixel array shown in FIG. 1 based on some implementations of the disclosed technology.

FIG. 2 is a cross-sectional view 100-1 illustrating an example of the unit pixel PX taken along the line A-A' in the pixel array 100 shown in FIG. 1.

Referring to FIG. 2, the cross-sectional view 100-1 of the unit pixel (PX) may be a cross-sectional view 100-1 illustrating the unit pixel (PX) of the pixel array 100 in the image sensing device 10.

Each unit pixel (PX) may include a microlens 110, an optical filter 120, a substrate 130, a photoelectric conversion element 140, a first reflector 150, and a second reflector 160.

The image sensing device 100 includes a plurality of photoelectric conversion elements 140. Each unit pixel (PX) may refer to a pixel unit including only one photoelectric conversion element 140 that is one of the plurality of photoelectric conversion elements 140 included in the image sensing device 100.

The microlens 110 may refer to a layer in which incident light is introduced into the unit pixel (PX), and may be disposed over the optical filter 120. The microlens 110 is structured to provide a lensing effect to light so that the optical path of incident light may be modified according to a refractive index, curvature, arrangement shape, etc. of the microlens 110. For example, the microlens 110 can be a convex lens to converge or focus incident light towards to the central region of the unit pixel (PX). This converging ability of the microlens 110 can be used to reduce or prevent optical crosstalk between adjacent unit pixels (PXs) and can increase light reception efficiency.

The optical filter 120 may be disposed between the microlens 110 and the substrate 130. The optical filter 120 may be arranged in a specific pattern based on a predefined design such that the optical filter 120 can correspond to each of the plurality of photoelectric conversion elements 140 based on the position of the unit pixels (PXs).

The optical filter 120 may be formed to have a thickness that is determined based on the amount of added pigments and required transmission characteristics. The optical filter 120 may filter infrared (IR) light (for example, near infrared (NIR) light) from among incident light received through the microlens 110, such that the filtered light can penetrate the optical filter 120. The optical filter 120 can be configured to selectively transmit the filtered light based on the wavelength. For example, the light having an infrared (IR) wavelength band of 850 nm to 940 nm can pass through the optical filter 120. The optical filter 120 may be formed per unit pixel (PX).

The substrate 130 may be a semiconductor substrate. The semiconductor substrate 130 may be in a monocrystalline state, and may include a silicon-containing material. In some implementations, the substrate 110 may include P-type impurities.

The photoelectric conversion element 140 may be formed in each unit pixel (PX) in the substrate 130. The photoelectric conversion element 140 may absorb incident light, and may accumulate charges corresponding to the amount of incident light (i.e., intensity of incident light) in an inner region thereof. The photoelectric conversion element 140 may be implemented in various configurations, including, for example, a photodiode (e.g., an inorganic photodiode), a phototransistor, a photogate, or a pinned photodiode (PPD) or a combination thereof.

In some implementations, the photoelectric conversion element 140 may include impurity regions that are vertically stacked in the substrate 130.

For example, if the photoelectric conversion element 140 is implemented as a photodiode, the photoelectric conversion element 140 may include a stacked structure in which an N-type impurity region and a P-type impurity region are vertically stacked. In this case, the N-type impurity region and the P-type impurity region of the photoelectric conversion element 140 may be formed by sequential ion implantation processes.

In some implementations, the arrangement of the photoelectric conversion element 140 in the substrate 130 may change according to wavelengths of target light to be sensed.

Infrared (IR) light (including near infrared (NIR) light) tends to have a deep arrival depth (or deep penetration depth) within the substrate 130. The deeper depth within the substrate 130 may refer to a position that is located further from the microlens 110 in a direction perpendicular to the substrate 130 which is along the negative direction of the Y-axis direction as shown in FIG. 2. For example, infrared (IR) light (such as near infrared (NIR) light) can relatively easily penetrate the substrate 130 and reach a deeper part of the substrate 130. Thus, in a device (or element) for sensing infrared (IR) light, the photoelectric conversion element 140 can be disposed at a deeper depth within the substrate 130 as compared to devices (or elements) for sensing other light of shorter wavelengths (e.g., blue light or green light).

For sensing infrared light having the deep penetration depth within the substrate 130, the photoelectric conversion element 140 can be arranged at a deeper position within the substrate 130 (e.g., further away from the microlens) corresponding to the deep penetration depth of the infrared light. Accordingly, it is necessary for the substrate 130 to increase its thickness. However, there are various technical issues that arise in connection with the increase of the thickness of the substrate 130, which include, for example, an increase in production costs, an increase in module size, etc.

If the photoelectric conversion element 140 is disposed at the position not corresponding to the deep penetration depth of the infrared light, the amount of light having penetrated the substrate 130 without being absorbed in the photoelectric conversion element 140 may increase, which results in the reduction in photoelectric conversion efficiency.

In recognition of the issues discussed above, some implementations of the disclosed technology provide the image sensing device that can minimize the reduction in photoelectric conversion efficiency without the increase of the thickness of the substrate for sensing infrared light. The image sensing device based on some implementations of the disclosed technology is designed to include a first reflector 150 and a second reflector 160, such that the optical path of infrared (IR) light can be increased in length due to the reflections via the first and second reflectors 150 and 160 prior to entry of the substrate. The use of the first and second reflectors 150 and 160 can eliminate the need to increase the thickness of the substrate and the image sensing device 10 can be minimized in size and increase the photoelectric conversion efficiency.

Referring to FIG. 2, in some implementations, the paths of vertical incident lights IL1 and IL2 can be extended in length by the first reflector 150 and the second reflector 160. Thus, an optical path of light can be extended to sufficiently secure the deep penetration depth of infrared (IR) light.

In some implementations, the photoelectric conversion element 140 may be disposed to overlap with at least some parts of the first reflector 150. Since the photoelectric conversion element 140 is disposed to overlap with at least some parts of the first reflector 150, at least some parts of incident light IL1 or IL2 that are vertically incident upon the microlens 110 can be reflected by the first reflector 150. Thus, the first reflector 150 operates to prevent each of the vertical incident lights IL1 and IL2 from reaching the photoelectric conversion element 140 through the shortest path. Instead of entering to the substrate 130 with the shortest path, the vertical incident lights IL1 and IL2 are reflected by the first reflector 150 and thus the optical paths of the vertical incident lights IL1 and 112 can be extended in length. Referring to FIG. 2, second reflectors 160 are located such that the light reflected by the first reflector 150 can be redirected toward the photoelectric conversion element 140. Thus, the optical path of the vertical incident light IL1 and IL2 increase due to the travel of light from the first reflector 150 to the second reflector 160 and another travel of light from the second reflector 160 to the photoelectric conversion element 140.

In some implementations, the first reflector 150 may be disposed between the second reflectors 160. Specifically, the first reflector 150 may be centrally located in the PX and two or more second reflectors 160 located at the peripheral of the PX so that the incident light is first reflected by the first reflector 150 towards the second reflectors 160 which in turn reflect the reflected light from the first reflector 150 via the space between the first reflector 150 and the second reflectors 160 to enter the photoelectric conversion element 140.

In some implementations, the first reflector 150 may have a plurality of first reflective surfaces (R1) configured to form a first angle ($\theta 1$) with respect to a surface of the substrate 130. The first reflective surfaces (R1) of the first reflector 150 may be configured in a manner that plural incident lights incident upon the photoelectric conversion element 140 can be reflected in the direction of the second reflectors 160.

Each of the first reflective surfaces (R1) of the first reflector 150 may form a first angle ($\theta 1$) with respect to one surface of the substrate 130. In some implementations, the first angle ($\theta 1$) may be determined based on at least one of a distance between the first reflector 150 and the photoelectric conversion element 140, the size of the first reflector 150, or the positional relationship between the first reflector 150 and the second reflectors 160.

The first reflector 150 may reflect each of vertical incident lights IL1 and IL2 that is vertically incident upon the photoelectric conversion element 140 in a direction away from the photoelectric conversion element 140.

In some implementations, the direction being away from the photoelectric conversion element 140 may include a direction away from a top surface of the photoelectric conversion element 140. For example, the incident lights IL1 and IL2 are reflected by the first reflector 150 to be away from the photoelectric conversion element 140 in a Y-axis direction.

In some implementations, the direction being away from the photoelectric conversion element 140 may include a direction in which incident light moves from the first reflector 150 to the second reflectors 160.

In some implementations, each of the second reflectors 160 may be located at the same height (i.e., the position with respect to the Y-axis) as the optical filter 120 with respect to the substrate 130.

For example, when the optical filter 120 is disposed between the microlens 110 and the substrate 130, the second reflectors 160 may be disposed between a bottom surface of the microlens 110 and a top surface of the substrate 130. The bottom surface of the microlens 110 and the top surface of the substrate 130 may refer to surfaces that are disposed in contact with the optical filter 120.

In some implementations, the second reflectors 160 may be arranged in a manner that some parts thereof can be shared by contiguous or adjacent unit pixels (PXs). For example, the second reflectors 160 may be disposed at a boundary between the unit pixels (PXs) located adjacent to each other.

The second reflector 160 may reflect incident light, and may be disposed at a boundary between the unit pixels (PXs) located adjacent to each other, such that the second reflector 160 can prevent optical crosstalk from occurring between the unit pixels (PXs).

The second reflector 160 may include a plurality of reflective surfaces. In some implementations, the second reflector 160 may be configured to include a plurality of reflective surfaces including a vertical reflective surface (VR2) and a second reflective surface (R2), thereby efficiently reflecting light reflected by the first reflector 150.

The second reflective surface (R2) may refer to a reflective surface that forms a second angle ($\theta 2$) with respect to the bottom surface of the microlens 110 from among the reflective surfaces of the second reflector 160.

In this case, the first reflective surface (R1) of the first reflector 150 and the second reflective surface (R2) of the second reflector 160 may be arranged to have a predetermined angle therebetween. For example, the predetermined angle may be set to any one of 7°~37°.

In some implementations, the vertical reflective surface (VR2) may refer to a surface that is perpendicular to the top surface of the substrate 130 and configured to reflect incident light.

In some other implementations, the vertical reflective surface (VR2) can be configured to have a predetermined angle with respect to the bottom surface of the microlens 110 instead of being perpendicular to the top surface of the substrate 130. In this case, the angle between the bottom surface of the microlens 110 and the vertical reflective surface (VR2) may be greater than the second angle (θ2). In this case, the vertical reflective surface (VR2) may extend to the substrate 130 while simultaneously having a predetermined angle with respect to the second reflective surface (R2).

In some implementations, the second reflector 160 may refer to a reflector that reflects each of the vertical incident lights IL1 and IL2 reflected by the first reflector 150 toward the photoelectric conversion element 140.

The second reflector 160 operates to reflect incident light toward the photoelectric conversion element 140. In some implementations, incident light reflected by the second reflective surface (R2) of the second reflector 160 may be guided to a specific point in the photoelectric conversion element 140 for the photo conversion that generates electrical signals based on the light arriving at the specific point, or may be guided to a focal point that enables plural incident lights to converge upon the photoelectric conversion element 140 by the microlens 110.

In some implementations, as the second reflector 160 gradually increases in width, the amount of incident light reflected to the outside of the unit pixel (PX) by the top surface of the second reflector 160 can increase in proportion to the increase in the width of the second reflector 160.

Here, the incident light reflected to the outside of the unit pixel (PX) may refer to specific incident light that is first reflected by the top surface of the second reflector 160 arranged parallel to the bottom surface of the microlens 110, enables the reflected light to penetrate the microlens 110, and enables the resultant light to be reflected back to the microlens 110 without being incident upon the optical filter 120. In this case, the bottom surface of the microlens 110 may refer to a surface that is in contact with the optical filter 120.

When the amount of incident light reflected to the outside of the unit pixel (PX) by the top surface of the second reflector 150 increases, the total amount of incident light to be incident upon the photoelectric conversion element 140 can be reduced, resulting in reduction in light reception efficiency.

In some implementations, in order to efficiently increase the length of the optical path of incident light using the first reflector 150 and the second reflector 160, the first angle (θ1) of the first reflector 150 and the second angle (θ2) of the second reflector 160 can be first determined experimentally.

When the first angle (θ1) of the first reflector 150 and the second angle (θ2) of the second reflector 160 are determined, the region of the second reflective surface (R2) may gradually increase in size in proportion to the increasing length of the second reflective surface (R2), such that light reflected by the first reflector 150 can be effectively reflected back. In contrast, as the region of the second reflective surface (R2) increases in size, the amount of incident light to be reflected to the outside of the unit pixel (PX) by the top surface of the second reflector 160 may also increase.

Therefore, there is a need for the length of the second reflective surface (R2) of the second reflector 160 to be reduced. If the length of the second reflective surface (R2) is excessively reduced, however, the reflection effect caused by the second reflective surface (R2) may be reduced and incident light reflected by the first reflector 150 may be applied to a contiguous (or adjacent) pixel, resulting in occurrence of optical crosstalk.

To address the above issues, the second reflector 160 may be configured in a manner that the vertical reflective surface (VR2) is disposed below the second reflective surface (R2), such that the reflection effect caused by the second reflective surface (R2) can be reinforced and optical crosstalk can be prevented from occurring in light reflected by the first reflector 150.

Thus, the second reflector 160 may include the vertical reflective surface (VR2), such that the angular relationship between the first reflective surface (R1) and the second reflective surface (R2) can be maintained and the top surface of the second reflector 160 can be reduced in width.

In some implementations, the shape of the second reflector 160 may be determined based on at least one of the positional relationship between the second reflector 160 and the first reflector 150, the first angle (θ1) of the first reflective surface (R1), or the second angle (θ2) of the second reflective surface (R2).

In some implementations, each of the vertical incident lights IL1 and IL2 reflected by the first reflector 150 and the second reflector 160 may include additional optical paths as compared to the image sensing device not including the first reflector 150 and the second reflector 160.

FIG. 2 illustrates exemplary optical paths of the vertical incident lights IL1 and IL2.

In some implementations, when the position and width of the first reflector 150 and the second reflector 160 are fixed, the second angle (θ2) may increase in proportion to the increase of the first angle (θ1).

The second angle (θ2) may be determined to be a specific angle through which the optical path changed by the first reflective surface (R1) of the first reflector 150 can be guided to the photoelectric conversion element 140. Thus, the second angle (θ2) may be decided based on the first angle (θ1).

In some implementations, the first angle (θ1) of the first reflector 150 may be set to, for example, be between 25° and 35°. In this case, the second angle (θ2) of the second reflector 160 may be set to be between 42° and 62°.

In some implementations, each of the first reflector 150 and the second reflector 160 may include at least one of tungsten (W), aluminum (Al), silicon oxide, copper (Cu), or tin (Sn) or the combination thereof.

In some implementations, incident light, that is configured to serve as an observation object of the image sensing device 10 while simultaneously having higher light reception efficiency, may be infrared (IR) light having a wavelength band of 850 nm and 940 nm from among infrared (IR) lights.

The image sensing device 10 based on some implementations of the disclosed technology may include the first reflector 150 and the second reflector 160, such that the optical paths of the vertical incident lights IL1 and IL2 can be significantly increased in length (e.g., 50% or more) as compared to image sensing devices 10 not including the first and second reflectors therein.

Incident light having infrared wavelengths (e.g., 850 nm to 940 nm) corresponding to the observation object of the image sensing device 10 based on some implementations of the disclosed technology may have a very low absorption rate in the substrate 130 having a relatively thin thickness.

As a result, the optical path of such incident light is extended in length through the reflectors, and the image sensing device 10 based on some implementations of the disclosed technology may have higher photoelectric conversion efficiency than other image sensing devices not including the first and second reflectors therein.

Figure 3:
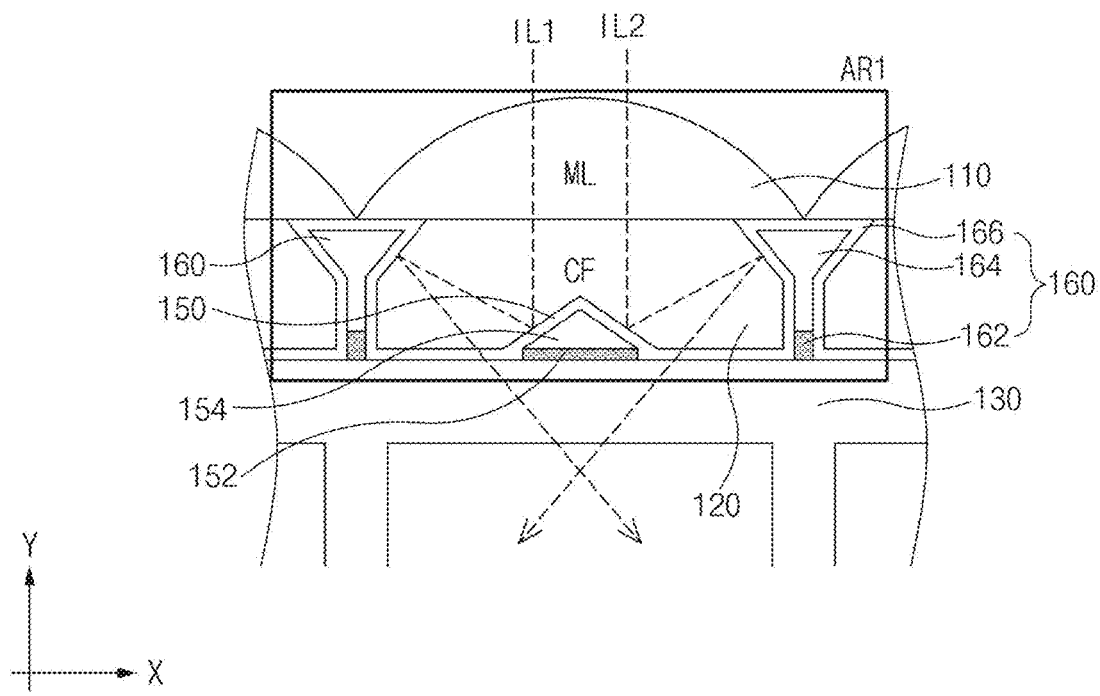
FIG. 3 is a cross-sectional view illustrating an example of some parts of the unit pixel taken along the line A-A' in the pixel array shown in FIG. 1 based on some implementations of the disclosed technology.

FIG. 3 is a cross-sectional view illustrating an example of some parts of the unit pixel taken along the line A-A' in the pixel array shown in FIG. 1 based on some implementations of the disclosed technology.

In FIG. 3, the same constituent elements as those of FIG. 2 will be used to refer to the same or like parts for convenience of description, and as such redundant description thereof will herein be omitted for brevity.

In some implementations, the first reflector 150 may include a metal layer 152, a low refractive index layer 154, and some parts of a capping film 166. In addition, the second reflector 160 may include a metal layer 162, a low refractive index layer 164, and some parts of the capping film 166.

In some implementations, each of the metal layer 152 of the first reflector 150 and the metal layer 162 of the second reflector 162 may include at least one of tungsten (W), aluminum (Al), copper (Cu), or tin (Sn).

In some implementations, each of the low refractive index layers 154 and 164 may be formed of or include materials (e.g., air) having a large difference in refractive index between the substrate 130 and each of the low refractive index layers 154 and 164. Since constituent materials included in each low refractive index layer 154 or 164 may have a lower refractive index than the substrate 130, the optical path of incident light can be adjusted through total reflection.

The capping film 166 may be a material film formed at an outermost part of each of the first reflector 150 and the second reflector 160, and may be formed to surround the low refractive index layers 154 and 164 and the metal layers 152 and 162 of the first and second reflectors 150 and 160. The capping film 166 may be formed to extend to a lower portion of the optical filter 120. In this case, the capping film 166 formed below the optical filter 120 may be used as an oxide film of a buffer layer (not shown). In some implementations, the capping film 166 may be formed of or include silicon oxide.

In some implementations, the first reflector 150 may be formed of only the metal layer 152, or may be formed of only the low refractive index layer 154. The second reflector 160 may be formed of only the metal layer 162, or may be formed of only the low refractive index layer 164. Alternatively, as can be seen from FIG. 3, the first reflector 150 may be formed of a combination of the metal layer 152 and the low refractive index layer 154, and the second reflector 160 may be formed of a combination of the metal layer 162 and the low refractive index layer 164.

Figure 4:
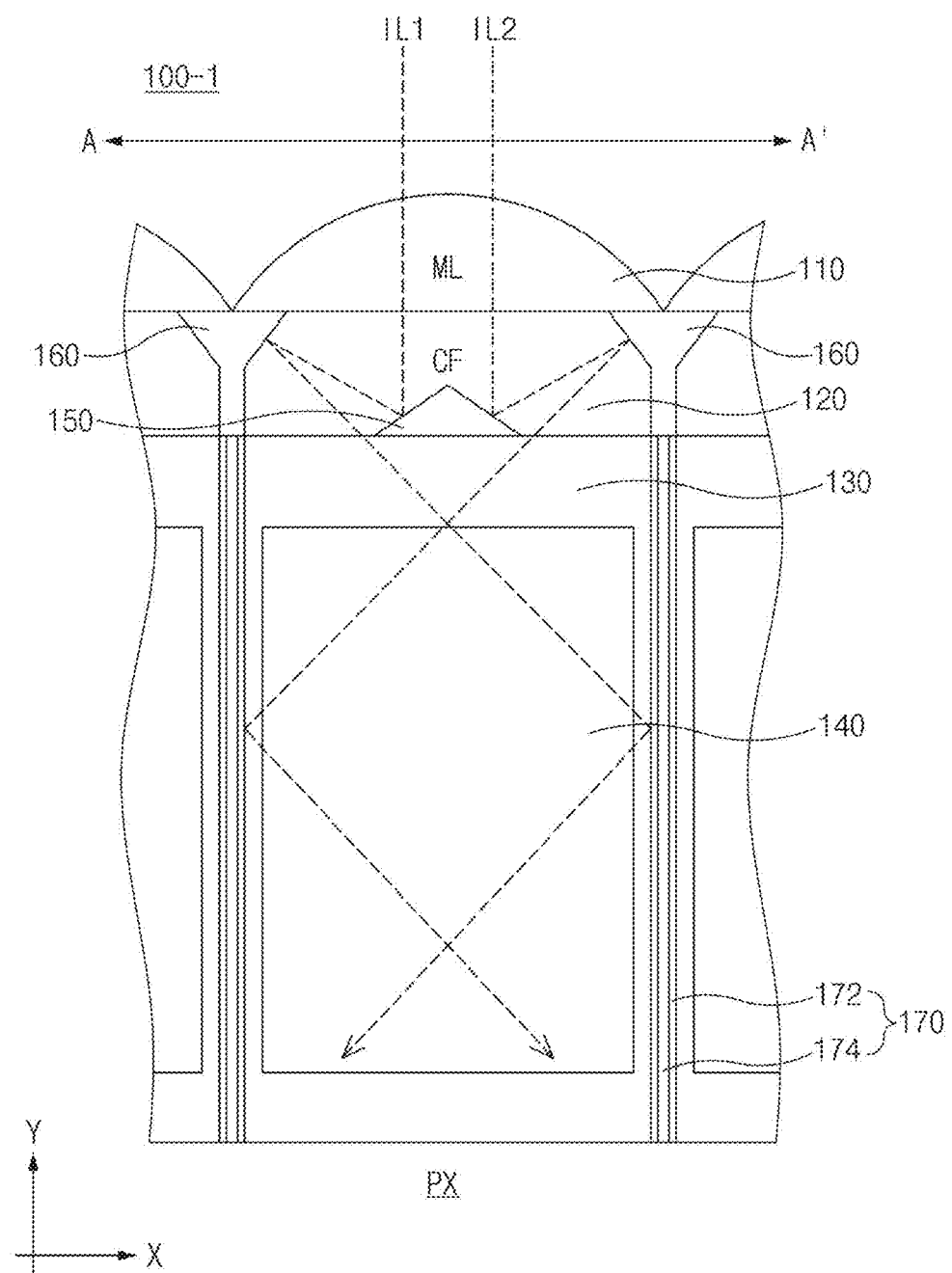
FIG. 4 is a cross-sectional view illustrating another example of some parts of the unit pixel taken along the line A-A' in the pixel array shown in FIG. 1 based on some implementations of the disclosed technology.

FIG. 4 is a cross-sectional view illustrating another example of some parts of the unit pixel taken along the line A-A' in the pixel array shown in FIG. 1 based on some implementations of the disclosed technology. Referring to FIG. 4, the image sensing device 10 according to another embodiment of the disclosed technology may further include an isolation region 170.

In FIG. 4, the same constituent elements as those of FIG. 2 will be used to refer to the same or like parts for convenience of description and better understanding of the disclosed technology, and as such redundant description thereof will herein be omitted for brevity.

The isolation region 170 may enable the photoelectric conversion element 140 to be physically isolated from another unit pixel located adjacent to the unit pixel (PX) including the photoelectric conversion element 140 therein. The P-type impurity region may be formed between the photoelectric conversion element 140 and the isolation region 170.

Each isolation region 170 may be formed perpendicular to one surface of the substrate 130. Alternatively, each isolation region 170 may be formed nearly perpendicular to one surface of the substrate 130. The isolation region 170 may include a trench-shaped isolation region in which an insulation material is buried in a trench formed by etching of the substrate 130. In some implementations, the isolation region 170 may include a Deep Trench Isolation (DTI) structure formed to penetrate the substrate 130.

The isolation region 170 may include materials by which incident light can be reflected. For example, the isolation region 170 may include metal materials (i.e., a metal layer) having a high reflection rate (i.e., high reflectivity). For example, the isolation region 170 may include at least one of aluminum (Al), silver (Ag), copper (Cu), or tin (Sn).

The isolation region 170 may be formed of or include materials having a difference in refractive index between the substrate 130 and the isolation region 170. For example, the isolation region 170 may include silicon oxide (i.e., an insulation layer) having a lower refractive index than the substrate 130. The isolation region 170 may be comprised of or include a plurality of layers. In particular, the isolation region 170 may include an inner layer 174 and an outer layer 172 surrounding the inner layer 174.

In some implementations, the inner layer 174 may include at least one of a metal layer and an air layer, and the outer layer 172 may be an insulation layer formed of or including silicon oxide.

By the isolation region 170, the vertical incident lights IL1 and IL2 reflected by the first reflector 150 and the second reflector 160 can be reflected into the photoelectric conversion element 140 such that the vertical incident lights IL1 and IL2 have extended optical paths.

In addition, the isolation region 170 may enable the photoelectric conversion element 140 to be physically isolated from the photoelectric conversion element 140 of another pixel located adjacent to the unit pixel (PX), such that the isolation region 170 can prevent optical crosstalk.

In some implementations, the second reflector 160 may enable the incident light reflected by the first reflector 150 to be reflected back to the isolation region 170.

Incident light reflected by the second reflector 160 toward the photoelectric conversion element 140 or the isolation region 170 may be reflected several times in the photoelectric conversion element 140 by the isolation region 170, such that the optical path can be extended in length.

Figure 5:
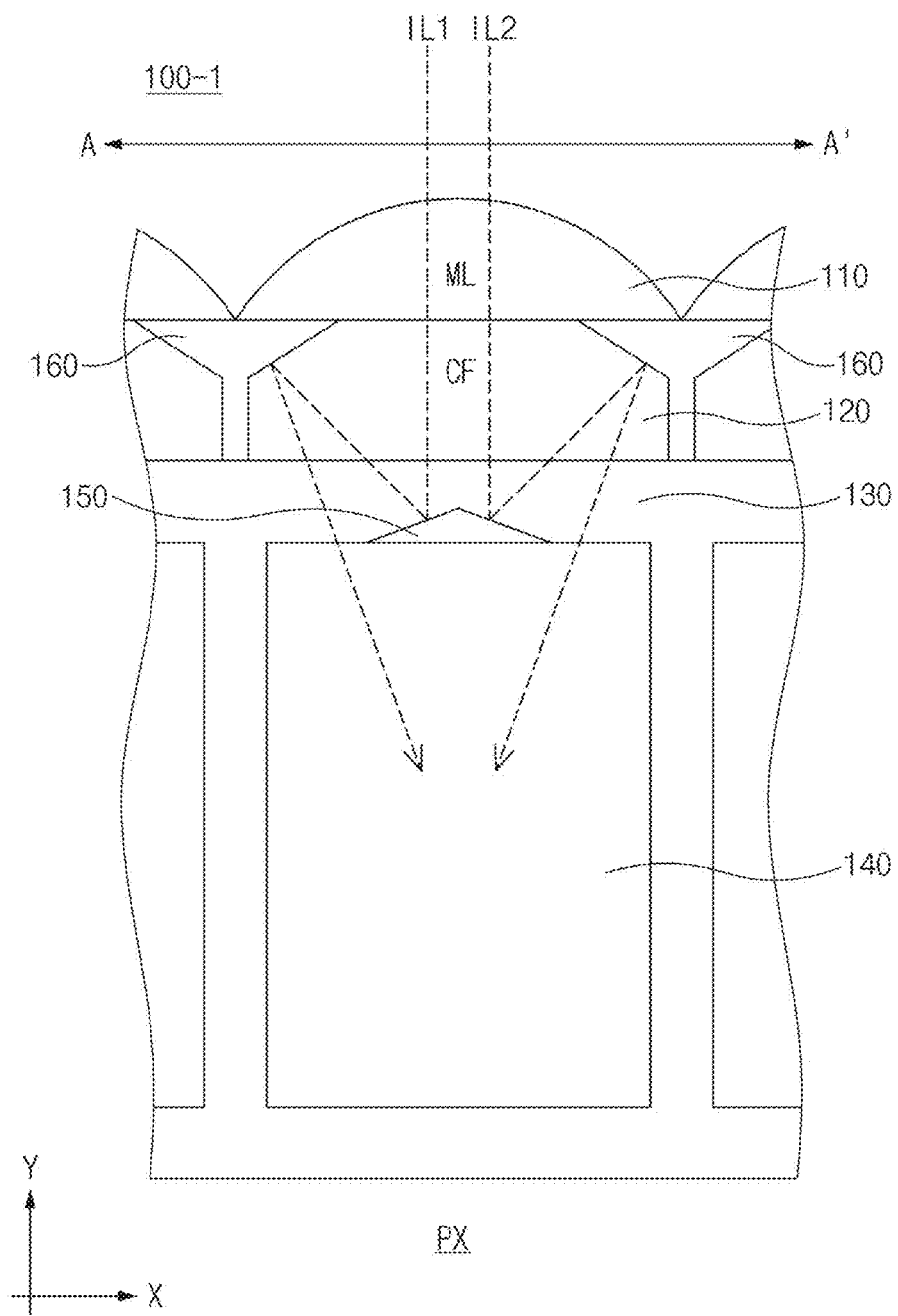
FIG. 5 is a cross-sectional view illustrating another example of some parts of the unit pixel taken along the line A-A' in the pixel array shown in FIG. 1 based on some implementations of the disclosed technology.

FIG. 5 is a cross-sectional view illustrating another example of some parts of the unit pixel taken along the line A-A' in the pixel array shown in FIG. 1 based on some implementations of the disclosed technology.

Referring to FIG. 5, the first reflector 150 may be disposed between the second reflectors 160, and may be disposed to overlap with the photoelectric conversion element 140. In this case, the first reflector 150 may be disposed in the substrate 130 between the optical filter 120 and the photoelectric conversion element 140. As the distance between the first reflector 150 and the photoelectric conversion element 140 reduces, the length of the optical paths of the vertical incident lights IL1 and IL2 becomes longer, resulting in improvement in photoelectric conversion efficiency.

In some implementations, the first reflector 150 may be positioned in a manner that the first reflector 150 is movable on an optical axis of the microlens 110 in a direction (e.g., Y-axis direction) perpendicular to a surface of the substrate 130 and overlaps with the photoelectric conversion element 140. In this case, if the position of the second reflector 160 and the second angle (θ2) of the second reflector 160 are fixed, the first angle (θ1) can be determined based on the position at which the first reflector 150 is disposed in the Y-axis direction.

In the above-mentioned implementations, as the first reflector 150 is disposed closer to the photoelectric conversion element 140, each of the vertical incident lights IL1 and IL2 may have a reflection path that is less deviated from the incident light path, resulting in a longer length of the optical path affected by the first reflector 150.

Figure 6:
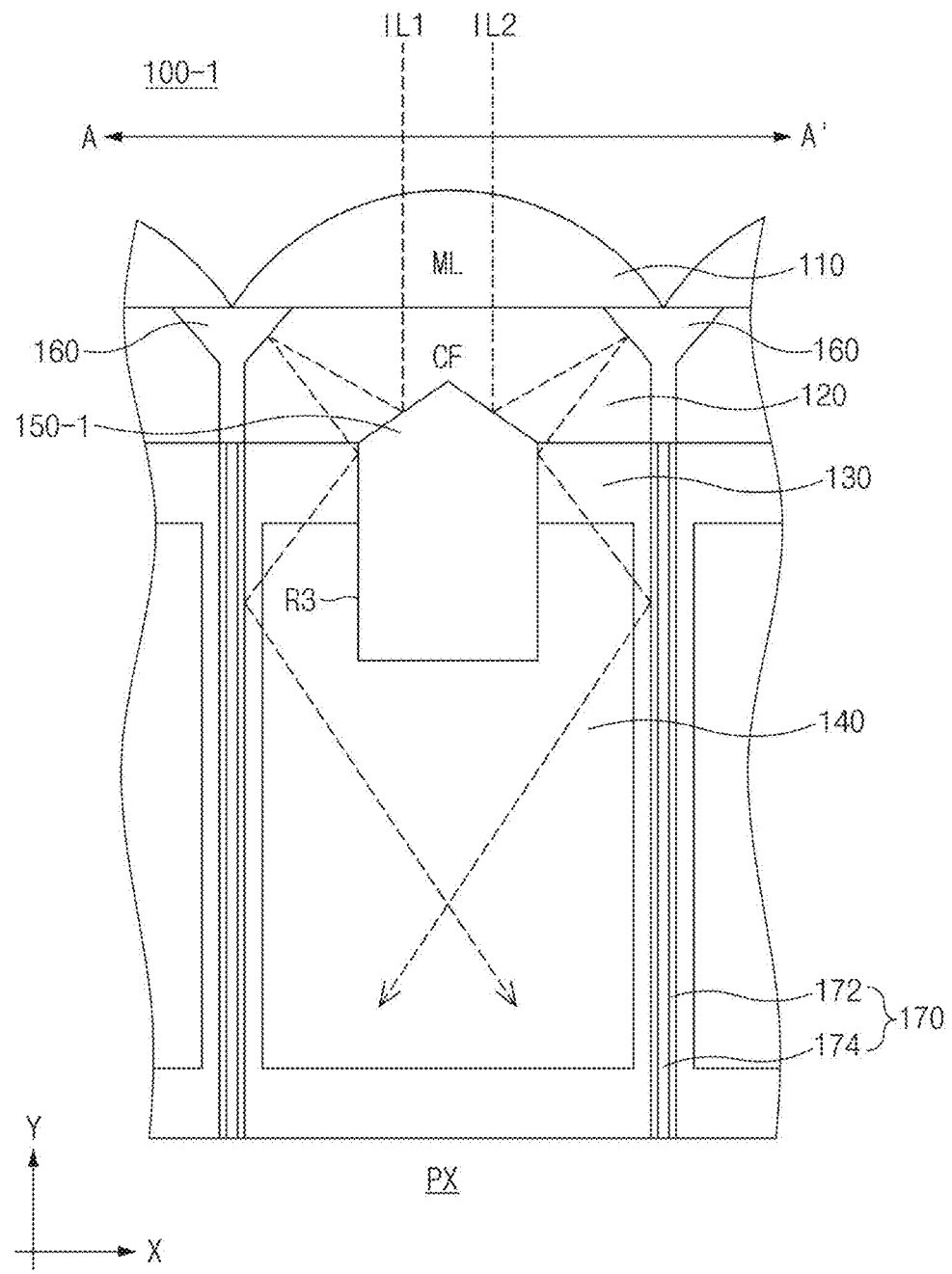
FIG. 6 is a cross-sectional view illustrating another example of a unit pixel in which a first reflector is extended to a photoelectric conversion element taken along the line A-A' in the pixel array shown in FIG. 1 based some implementations of the disclosed technology.

FIG. 6 is a cross-sectional view illustrating another example of the unit pixel (PX) in which a first reflector 150-1 is extended to the photoelectric conversion element 140 taken along the line A-A' in the pixel array shown in FIG. 1 based some implementations of the disclosed technology.

Referring to FIG. 6, some parts of the first reflector 150-1 may be formed to extend into the photoelectric conversion element 140. In this case, the first reflector 150-1 may have a third reflective surface (R3) extending toward the photoelectric conversion element 140.

Some parts of the first reflector 150-1 may be formed to extend into the photoelectric conversion element 140, such that the optical path of each of the vertical incident lights IL1 and IL2 that are reflected from the second reflector 160 or from the isolation region 170 can be additionally extended in length by the third reflective surface (R3) of the first reflector 150-1.

In some implementations, the third reflective surface (R3) may enable the incident light reflected by the second reflective surface (R2) or by the isolation region 170 to be reflected back toward the isolation region 170.

In FIG. 6, the first reflector 150-1 may be formed in some parts of the photoelectric conversion element 140 through a Shallow Trench Isolation (STI) process.

In some implementations, the first reflector 150-1 may include at least one of tungsten (W), aluminum (Al), silicon oxide, copper (Cu), or tin (Sn).

Figure 7:
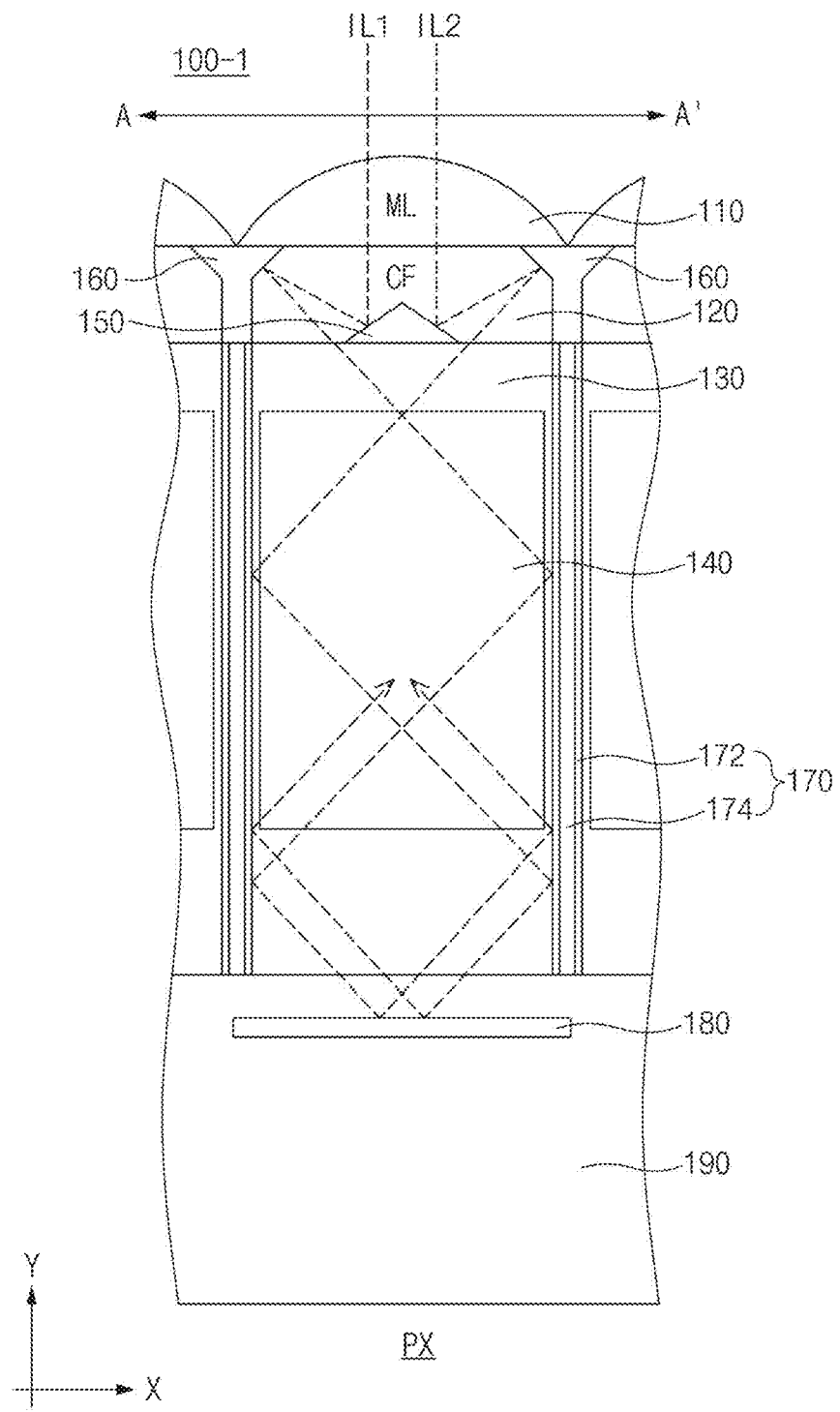
FIG. 7 is a cross-sectional view illustrating another example of a unit pixel including a lower reflective layer taken along the line A-A' in the pixel array shown in FIG. 1 based some implementations of the disclosed technology.

FIG. 7 is a cross-sectional view illustrating another example of the unit pixel (PX) including a lower reflective layer 180 taken along the line A-A' in the pixel array shown in FIG. 1 based some implementations of the disclosed technology.

Referring to FIG. 7, the image sensing device 10 may further include a lower reflective layer 180 in an line region 190 (e.g., an interconnect layer) 190. The line region 190 may be disposed below the photoelectric conversion element 140.

The line region 190 may be a region in which lines (or interconnects) for transmitting and receiving either output signals of the plurality of unit pixels (PXs) of the image sensing device 10 or input signals of transistors included in the image sensing device 10 are included. For convenience of description, a detailed line (or interconnect) structure will herein be omitted from FIG. 7.

The lower reflective layer 180 may enable incident light having penetrated the substrate 130 to be reflected back to the photoelectric conversion element 140. As a result, the optical paths of such incident light can be additionally extended in length, resulting in an increase in photoelectric conversion efficiency.

In some implementations, the lower reflective layer 180 may include a metal material. In this case, the metal material may include at least one of aluminum (Al), silver (Ag), or copper (Cu).

Wavelengths having a wavelength range greater than that of infrared (IR) light may enable a penetration depth for silicon to be greater than 5 microns. When the photoelectric conversion element 140 is formed of or includes silicon and has a thickness of less than 3 microns, it becomes hard for the photoelectric conversion element 140 to effectively perform conversion of such incident light. Thus, the incident light may not be converted into electrical signals since incident infrared (IR) light does not have a sufficient penetration depth.

The first reflector 150, the second reflector 160, and the lower reflective layer 180 may be introduced into the image sensing device 10, such that the optical path of incident light can increase in length or light reflection toward the photoelectric conversion element 140 can be repeatedly performed, such that the penetration depth of the incident light can increase and thus a rate of light conversion that is not converted into electrical signals can be reduced.

In some other implementations, the shapes of the first reflective surface (R1) and the second reflective surface (R2) of the first reflector 150 and the second reflector 160 may change based on locations of the first reflector 150 and the second reflector 160 in the pixel array.

For example, incident light for one unit pixel (PX) located at the edge part of the pixel array may be incident upon the one unit pixel (PX) at a more oblique angle than another incident light for another unit pixel (PX) located at the center part of the pixel array.

Therefore, the reflective surfaces R1 and R2 of the first and second reflectors 150 and 160 located at the edge part of the pixel array may be disposed to have an asymmetrical shape rather than a symmetrical shape, resulting in an increase in light reception (Rx) efficiency.

In some implementations, the first reflector 150 of the unit pixel (PX) located at a left edge part of the pixel region may be disposed to deflect to the left with respect to the optical axis of the microlens 110. In addition, the first reflective surface (R1) of the first reflector 150 deflected to the left may be formed in a shape in which the right first reflective surface is longer in length than the left first reflective surface. The second reflective surface (R2) of the second reflector 160 may be formed in a shape in which the length of the second reflective surface (R2) arranged to face the first reflective surface (R1) is proportional to the length of the first reflective surface (R1), such that the second reflective surface (R2) of the second reflector 160 can also correspond to the first reflective surface (R1) of the first reflector 150 having an asymmetrical shape.

As is apparent from the above description, the image sensing device based on some implementations of the disclosed technology can sense infrared (IR) light, and can increase sensitivity to the infrared (IR) light and photoelectric conversion efficiency.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device, comprising:
    a substrate structured to support a photoelectric conversion element which generates photocharges in response to light incident to the photoelectric conversion element;
    a first reflector located to spatially overlap with a portion of the photoelectric conversion element to receive light and configured to reflect the light incident to the photoelectric conversion element in a direction away from the photoelectric conversion element;
    a second reflector disposed to be spaced from the first reflector and configured to reflect the light reflected by the first reflector back towards the photoelectric conversion element; and
    a microlens configured to converge the light upon the photoelectric conversion element,
    wherein the first reflector includes a first reflective surface that forms a first angle with respect to a top surface of the substrate, and
    the second reflector includes a second reflective surface that forms a second angle with respect to a bottom surface of the microlens.

2. The image sensing device according to claim 1, wherein the first angle is between 25° and 35°.

3. The image sensing device according to claim 1, wherein the second angle is between 42° and 62°.

4. The image sensing device according to claim 1, wherein the second reflector further includes:
    a vertical reflective surface extending to the substrate and forming a predetermined angle with respect to the second reflective surface.

5. The image sensing device according to claim 1, wherein the first reflector includes at least one of a metal layer or a low refractive index layer.

6. The image sensing device according to claim 1, wherein the second reflector includes at least one of a metal layer or a low refractive index layer.

7. The image sensing device according to claim 1, wherein:
    the second reflector is disposed at a boundary of a unit pixel including the photoelectric conversion element.

8. The image sensing device according to claim 7, further comprising an additional second reflector disposed on an opposite side of the second reflector such that the first reflector is disposed between the second reflector and the additional second reflector.

9. The image sensing device according to claim 1, wherein:
    at least one of the first reflector and the second reflector includes at least one of aluminum (Al), silver (Ag), silicon oxide, copper (Cu), or tin (Sn).

10. The image sensing device according to claim 1, further comprising:
    an isolation region configured to physically isolate the photoelectric conversion element from another photoelectric conversion element located adjacent to the photoelectric conversion element.

11. The image sensing device according to claim 10, wherein the second reflector is configured to reflect the light reflected by the first reflector toward the isolation region.

12. The image sensing device according to claim 10, wherein:
    the isolation region includes an inner layer and an outer layer surrounding the inner layer,
    wherein the inner layer includes at least one of a metal layer or an air layer, and the outer layer includes an insulation material.

13. The image sensing device according to claim 10, wherein:
    the first reflector further includes a third reflective surface extending to the photoelectric conversion element, and
    wherein the third reflective surface is configured to reflect the light reflected by the second reflective surface toward the isolation region.

14. The image sensing device according to claim 1, further comprising:
    a line region disposed below the substrate;
    wherein the line region includes a lower reflective layer that operates to reflect the light penetrated the substrate back toward the photoelectric conversion element.

15. The image sensing device according to claim 14, wherein:
    the lower reflective layer includes at least one of silver (Ag), copper (Cu), or aluminum (Al).

16. An image sensing device, comprising:
    a substrate;
    an image sensing pixel supported by the substrate and including a photoelectric conversion element that generates photocharges in response to light incident to the photoelectric conversion element;
    a microlenses disposed over the image sensing pixel and configured to allow the light to converge upon the photoelectric conversion element;
    a reflecting structure disposed between the photoelectric conversion elements and the microlenses and configured to increase an optical path length of the light to reach the photoelectric conversion element, and
    wherein the reflecting structure includes a first reflector disposed over the photoelectric conversion element such that the first reflector has a portion overlapping with the photoelectric conversion element, the first reflector configured to reflect the light to be away from the photoelectric conversion element, and
    wherein the reflecting structure includes a second reflector disposed at a boundary of the image sensing pixel and configured to redirect the light reflected by the first reflector toward back to the photoelectric conversion element, and wherein the first reflector includes a first reflective surface that forms a first angle with respect to a top surface of the substrate, and the second reflector includes a second reflective surface that forms a second angle with respect to a bottom surface of the microlens.

17. The image sensing device according to claim 16, wherein the reflecting structure includes at least one of aluminum (Al), silver (Ag), silicon oxide, copper (Cu), or tin (Sn).

18. An image sensing device, comprising:
- a substrate structured to support a photoelectric conversion element which generates photocharges in response to light incident to the photoelectric conversion element;
- a first reflector located to spatially overlap with a portion of the photoelectric conversion element to receive light and configured to reflect the light incident to the photoelectric conversion element in a direction away from the photoelectric conversion element;
- a second reflector disposed to be spaced from the first reflector and configured to reflect the light reflected by the first reflector back towards the photoelectric conversion element; and
- a microlens configured to converge the light upon the photoelectric conversion element, wherein the second reflector includes a second reflective surface that forms a second angle with respect to a bottom surface of the microlens; and a vertical reflective surface extending to the substrate and forming a predetermined angle with respect to the second reflective surface.

19. The image sensing device of claim 18, wherein the second reflector is disposed at a boundary of a unit pixel including the photoelectric conversion element.

* * * * *